(12) United States Patent
Coffy et al.

(10) Patent No.: US 9,105,766 B2
(45) Date of Patent: Aug. 11, 2015

(54) OPTICAL ELECTRONIC PACKAGE

(71) Applicants: STMicroelectronics (Grenoble 2) SAS, Grenoble (FR); STMicroelectronics Pte Ltd, Singapore (SG)

(72) Inventors: Romain Coffy, Saint Martin le Vinoux (FR); Eric Saugier, Villard Bonnot (FR); Hk Looi, Singapore (SG); Norbert Chevrier, Fontaine (FR)

(73) Assignees: STMicroelectronics (Grenoble 2) SAS, Grenoble (FR); STMicroelectronics PTE LTD, Singapore (SG)

( * ) Notice: Subject to any disclaimer, the term of this patent is extended or adjusted under 35 U.S.C. 154(b) by 205 days.

(21) Appl. No.: 13/845,445

(22) Filed: Mar. 18, 2013

(65) Prior Publication Data
US 2013/0248887 A1    Sep. 26, 2013

(30) Foreign Application Priority Data
Mar. 22, 2012 (FR) ...................... 1252572

(51) Int. Cl.
*H01L 33/48* (2010.01)
*H01L 31/0203* (2014.01)
*H01L 31/18* (2006.01)
*G01S 17/02* (2006.01)
*H01L 25/16* (2006.01)
*H03K 17/94* (2006.01)
*G01S 7/481* (2006.01)
*H03K 17/945* (2006.01)

(52) U.S. Cl.
CPC ............. *H01L 31/0203* (2013.01); *G01S 7/481* (2013.01); *G01S 17/026* (2013.01); *H01L 25/167* (2013.01); *H01L 31/18* (2013.01); *H03K 17/941* (2013.01); *H01L 2224/48091* (2013.01); *H01L 2224/49175* (2013.01); *H03K 2017/9455* (2013.01); *H03K 2217/94026* (2013.01); *H03K 2217/94112* (2013.01)

(58) Field of Classification Search
CPC ................................ H01L 33/48; B65D 85/00
See application file for complete search history.

(56) References Cited

U.S. PATENT DOCUMENTS

| 5,130,531 A | 7/1992 | Ito et al. |
| 5,226,052 A | 7/1993 | Tanaka et al. |
| 6,787,869 B1 | 9/2004 | Vittu |
| 7,539,366 B1 | 5/2009 | Baks et al. |
| 2003/0111588 A1 | 6/2003 | Chen |

(Continued)

FOREIGN PATENT DOCUMENTS

| DE | 19616969 A1 | 10/1997 |
| EP | 0992824 A2 | 4/2000 |

OTHER PUBLICATIONS

French Search Report and Written Opinion for FR 1252572 mailed Nov. 1, 2012 (8 pages).

*Primary Examiner* — Mohammad Choudhry
(74) *Attorney, Agent, or Firm* — Gardere Wynne Sewell LLP

(57) ABSTRACT

An optical electronic package includes transmitting chip and a receiving chip fixed to a wafer. A transparent encapsulation structure is formed by a transparent plate and a transparent encapsulation block that are formed over the transmitter chip and at least a portion of the receiver chip, with the transparent encapsulation block embedding the transmitter chip. An opaque encapsulation block extends over the transparent plate and includes an opening that reveals a front area of the transparent plate. The front area is situated above an optical transmitter of the transmitting chip and is offset laterally relative to an optical sensor of the receiving chip.

17 Claims, 8 Drawing Sheets

(56) References Cited

U.S. PATENT DOCUMENTS

| | | |
|---|---|---|
| 2005/0254758 A1 | 11/2005 | Kropp |
| 2009/0045498 A1 | 2/2009 | Braden et al. |
| 2009/0051804 A1 | 2/2009 | Nomura et al. |
| 2010/0029766 A1 | 2/2010 | Barclay et al. |
| 2010/0096659 A1 | 4/2010 | Noma |
| 2011/0024627 A1 | 2/2011 | Yao |
| 2011/0057102 A1 | 3/2011 | Yao |
| 2011/0057108 A1 | 3/2011 | Yao et al. |
| 2011/0057129 A1 | 3/2011 | Yao et al. |
| 2011/0204233 A1 | 8/2011 | Costello et al. |

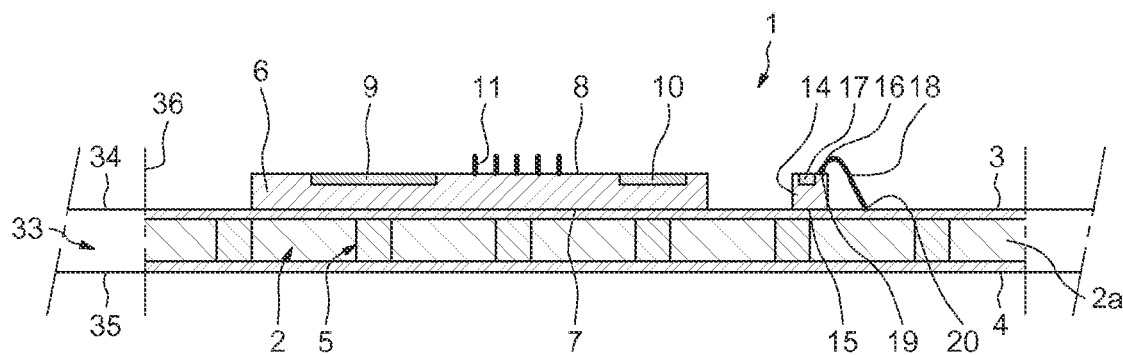
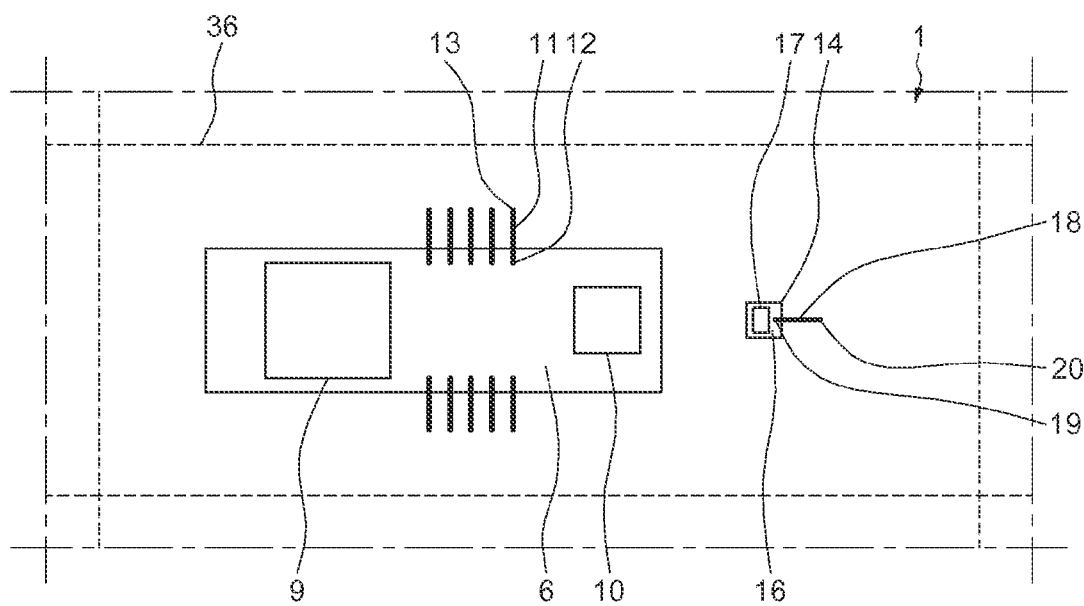
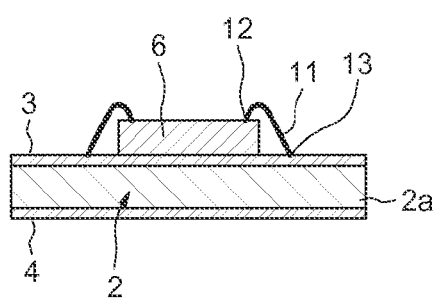

OPTICAL ELECTRONIC PACKAGE

PRIORITY CLAIM

This application claims priority from French Application for Patent No. 1252572 filed Mar. 22, 2012, the disclosure of which is incorporated by reference.

TECHNICAL FIELD

The present invention relates to the field of electronic packages comprising, for example, optical electronic devices.

BACKGROUND

Electronic structures are known which comprise mounting plates, first integrated circuit chips provided with optical detectors and second integrated circuit chips provided with optical transmitters, these chips being bonded to the mounting plates. Opaque covers provided with transparent portions are bonded to the mounting plates and form separate chambers in which the chips are placed.

These known electronic structures require the use of mounting plates and the fabrication of specially sized covers, lead to numerous mounting steps and external electrical connection difficulties with regard to the integrated circuit chips, and have large dimensions relative to the size of the integrated circuit chips.

There is a need for an electronic package which is generally more simple and more efficient and consequently less costly.

SUMMARY

An electronic package is proposed which comprises a substrate wafer having a front face and a rear face; at least one transmitting integrated circuit chip having a rear face fixed to the front face of the substrate wafer and comprising, in a front face, a light radiation optical transmitter; at least one receiving integrated circuit chip having a rear face fixed to the front face of the substrate wafer and comprising, in a front face, at least one light radiation optical sensor.

The proposed electronic package also comprises a transparent encapsulation means comprising a transparent plate extending over said optical sensor and over said optical transmitter and a transparent encapsulation block which extends between the rear face of the transparent plate and the front face of the receiving chip and between the rear face of the transparent plate and the front face of the substrate wafer, embedding the transmitting chip.

The proposed electronic package also comprises an opaque encapsulation means formed by an opaque encapsulation block of the transparent encapsulation means, this opaque encapsulation block extending over the front face of the transparent plate and having a front through opening which reveals a front area of the transparent plate, this front area being situated above the optical transmitter of the transmitting chip and offset laterally relative to the optical sensor of the receiving chip.

An optical electronic package is also proposed which comprises a substrate wafer having a front face and a rear face; at least one transmitting integrated circuit chip having a rear face fixed to the front face of the substrate wafer and comprising, in a front face, a light radiation optical transmitter; and at least one receiving integrated circuit chip having a rear face fixed to the front face of the substrate wafer and comprising, in a front face, at least one main light radiation optical sensor and one secondary light radiation optical sensor.

A transparent encapsulation means comprises a secondary transparent plate extending over said secondary optical sensor and over said optical transmitter and a transparent encapsulation block which extends between the rear face of the transparent plate and the front face of the receiving chip including the secondary sensor and between the rear face of the transparent plate and the front face of the substrate wafer, embedding the transmitting chip.

A transparent plate can be placed over the main optical sensor.

An opaque encapsulation means is formed by an opaque encapsulation block of the receiving chip, of the receiving chip and of the transparent encapsulation means.

Said opaque encapsulation block extends over the front face of the transparent plate and has a secondary front through opening which reveals a front area of the transparent plate, this front area being situated above the optical transmitter of the transmitting chip and offset laterally relative to the optical sensor of the receiving chip. Said opaque encapsulation block also has a main front through opening in which the main transparent plate is situated.

Said opaque encapsulation block may cover the main transparent plate, this covering part having a main through opening.

A diffusion substance may be provided in the main through opening and/or in the secondary through opening of the opaque encapsulation block.

The substrate wafer may comprise an electrical connection network linked to said integrated circuit chips and is provided with external electrical connection elements.

Also proposed is a portable or mobile telephone which comprises, internally, a package as above, in which the shell of the telephone has at least one opening situated at least facing at least one of said through passages.

Also proposed is a method for fabricating the optical electronic package as above, which comprises: fixing the receiving chip and the transmitting chip on the substrate wafer and linking these chips to this wafer; producing the transparent encapsulation means by depositing a drop of a liquid material on an area corresponding to the transparent encapsulation block to be produced and by placing the transparent plate on said drop so as to crush it, so that, after hardening, the transparent encapsulation block is formed; producing the opaque encapsulation block, this opaque encapsulation block covering the secondary transparent plate and surrounding the main plate, producing the through opening above the transparent plate of the transparent encapsulation means.

BRIEF DESCRIPTION OF THE DRAWINGS

Optical electronic packages according to the present invention will now be described by way of nonlimiting examples, illustrated by the appended drawing in which:

FIGS. 3 to 14 represent steps in the fabrication of the electronic package of FIG. 1.

DETAILED DESCRIPTION OF THE DRAWINGS

Figure 1:
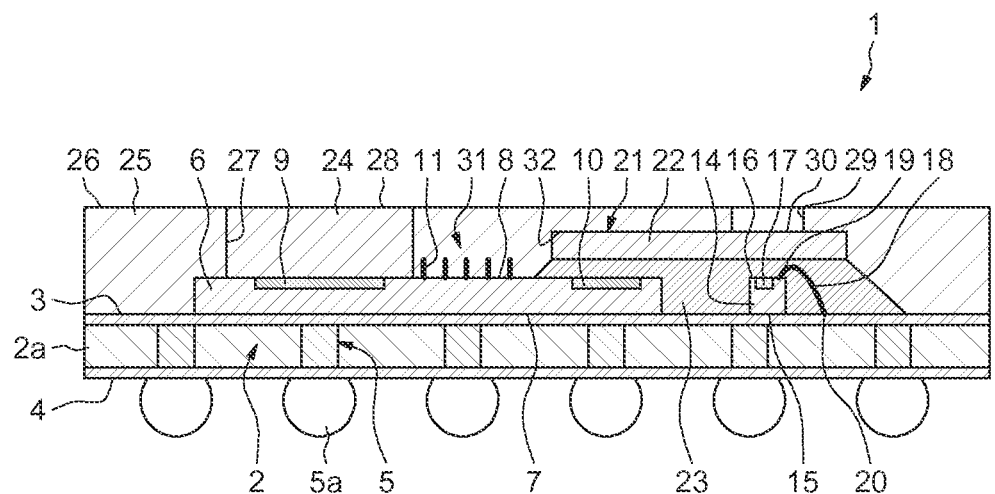
FIG. 1 represents a longitudinal cross section of an electronic package according to the present invention.
Figure 2:
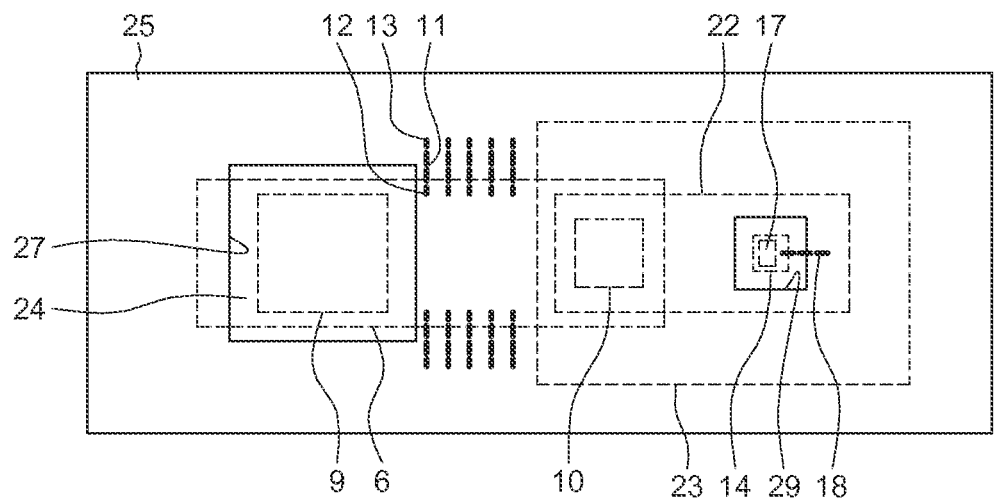
FIG. 2 represents a plane view of the electronic package of FIG. 1.

As illustrated in FIGS. 1 and 2, an optical electronic package 1 comprises an opaque substrate wafer 2 which has opposite front and rear faces 3 and 4 and which comprises an electrically insulating material 2a and an integrated electrical connection network 5 making it possible to produce electrical connections from one face to the other and on the faces 3 and 4.

The electronic package 1 comprises a receiving integrated circuit chip 6, the rear face 7 of which is fixed to the front face 3 of the substrate wafer 2, for example via a layer of glue, and the front face 8 of which comprises, on areas spaced apart, a main light radiation integrated optical sensor 9 and a secondary light radiation integrated optical sensor 10, spaced apart from one another. The main optical sensor 9 may comprise one or more sensitive areas spaced apart.

The integrated circuit chip 6 is electrically connected to the electrical connection network 5 of the substrate wafer 2 via a plurality of electrical connection wires 11 which selectively link bump contacts 12 of the front face of the integrated circuit chip 6 and bump contacts 13 of the front face 3 of the substrate wafer 2.

The electronic package 1 comprises a transmitting integrated circuit chip 14, the rear face 15 of which is fixed to the front face 3 of the substrate wafer 2, for example via a layer of conductive glue, and the front face 16 of which comprises, over an area, an integrated optical transmitter 17 capable of transmitting a light radiation in front of its front face 16.

The transmitting integrated circuit chip 14 is electrically connected to the electrical connection network 5 of the substrate wafer 2 via at least one electrical connection wire 18 which links a bump contact 19 of the front face of the integrated circuit chip 6 and a bump contact 20 of the front face 3 of the substrate wafer 2.

According to a particular exemplary embodiment, the substrate wafer 2 is rectangular, the receiving integrated circuit chip 6 is rectangular and extends longitudinally along the longitudinal axis of the substrate wafer 2 and the integrated circuit chip 14 is also placed along the longitudinal axis of the substrate wafer 2. The main optical sensor 9, the secondary optical sensor 10 and the optical transmitter 17 are also placed along the longitudinal axis of the substrate wafer 2, the optical transmitter 17 being on the side of the secondary optical sensor 10.

The electronic package 1 comprises a transparent or translucent encapsulation means 21 in order to optically couple the optical transmitter 17 to the secondary optical sensor 10, that is to say suitable for a portion of the light radiation transmitted by the optical transmitter 17 to reach the secondary optical sensor 10.

The transparent encapsulation means 21 comprises a secondary rectangular plate 22, transparent or translucent, for example made of glass, which extends, parallel, above and at a distance from the portion of the front face 8 of the receiving chip 6 including the secondary sensor 10 and above and at a distance from the front face 8 of the transmitting chip 14 including the optical transmitter 17, but with the secondary plate 22 being longitudinally at a distance from the main sensor 9.

The transparent encapsulation means 21 comprises an encapsulation block 23 made of a transparent or translucent material, for example made of a transparent resin, formed on the front face 3 of the substrate wafer 2 and which extends between the rear face of the transparent plate 22 and the front face 8 of the receiving chip 6 and between the rear face of the transparent plate 22 and the front face 3 of the substrate wafer 2, embedding the transmitting chip 14.

The electronic package 1 also comprises a main rectangular transparent plate 24, for example made of glass, which is fixed to the front face 8 of the receiving chip 6, for example via a layer of transparent glue, and which covers the main optical sensor 9. The front face of the transparent plate 24 is, for example, further forward than the front face of the transparent plate 22.

The electronic package 1 also comprises an opaque encapsulation means formed by an encapsulation block 25 made of an opaque material, for example made of an opaque epoxy resin, which is formed on the front face 3 of the substrate wafer 2, in which are embedded the receiving chip 6, the electrical connection wires 11 and the transparent encapsulation means 21, and which surrounds the transparent plate 24, so that the opaque encapsulation block 25 extends over the front face of the transparent plate 22 and has a frontal face 26 parallel to the front face 3 of the substrate wafer 2 and that, on its own, the frontal face 28 of the transparent plate 24 is not covered, this transparent plate 24 being peripherally held in a main through opening 27 of the opaque encapsulation block 25.

The opaque encapsulation block 25 has a secondary through opening 29 which reveals a front area 30 of the transparent plate 22, this front area 30 being situated above the optical transmitter 17 of the transmitting chip 14 and laterally offset in relation to the secondary optical sensor 10 of the receiving chip 6.

The opaque encapsulation block 25 extends over the areas of the receiving chip 6 that are not covered by the transparent encapsulation means 21 and the main transparent plate 24 and thus fills the space between, on the one hand, the transparent plate 22 and the transparent encapsulation block 23 and, on the other hand, the transparent plate 24. Consequently, the opaque encapsulation block 25 forms an opaque barrier 31 between the main optical sensor 9 and the secondary optical sensor 10 of the receiving chip 6. The transparent encapsulation means 21 comprising the transparent plate 22 and the transparent encapsulation block 23 extends into a cavity 32 formed in the opaque encapsulation block 25.

In order to electrically link the electronic package 1 to another component such as a printed circuit board (not represented), the rear face 4 of the substrate wafer 2 can be provided with metallic electrical connection elements 33, such as balls or columns, placed on rear bump contacts of the electrical connection network 5.

The electronic package 1 operates as follows.

The light radiation transmitted by the optical transmitter 17 of the transmitting chip 14 is diffused in the encapsulation block 23 and the transparent plate 22 then is transmitted outwards through the secondary through opening 29 of the opaque encapsulation block 25 and reaches the secondary sensor 10 of the receiving chip 6, possibly with reflections on the internal surface of the cavity 31.

Moreover, the main optical sensor 9 of the receiving chip 6 receives the external light radiation through the transparent plate 24.

Thus, the secondary optical sensor 10 of the receiving chip 6 receives light radiation mostly from the optical transmitter 17 of the transmitting chip 14 and secondarily from the outside through the offset front opening 29, the signal from the secondary optical sensor 10 being able to form a reference for the analysis of the signal from the main optical sensor 9 of the receiving chip 6.

The result of the above is that the electronic package 1 can be used as proximity detector.

The electronic package 1 can be obtained from a collective fabrication that will now be described.

As illustrated in FIGS. 3 to 5, there is a collective substrate plate 33 having front and rear faces 34 and 35, and having a plurality of adjacent placements 36 established in a matrix configuration and corresponding to a plurality of electronic packages 1 to be produced. In each placement 36, the collective substrate plate 33 comprises an electrical connection network 5.

In each placement the receiving integrated circuit chip 6 and the transmitting integrated circuit chip 14 are installed and the electrical connection wires 11 and 18 are placed.

Figure 6:
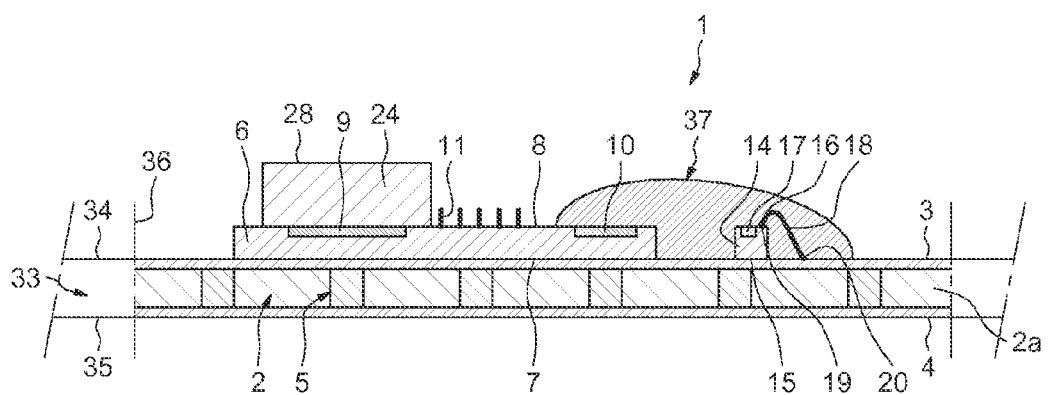

Then, as illustrated in FIG. 6, a drop of transparent liquid resin 37 is deposited in each placement 36, over the area of the transparent block 23 to be produced.

Figure 7:
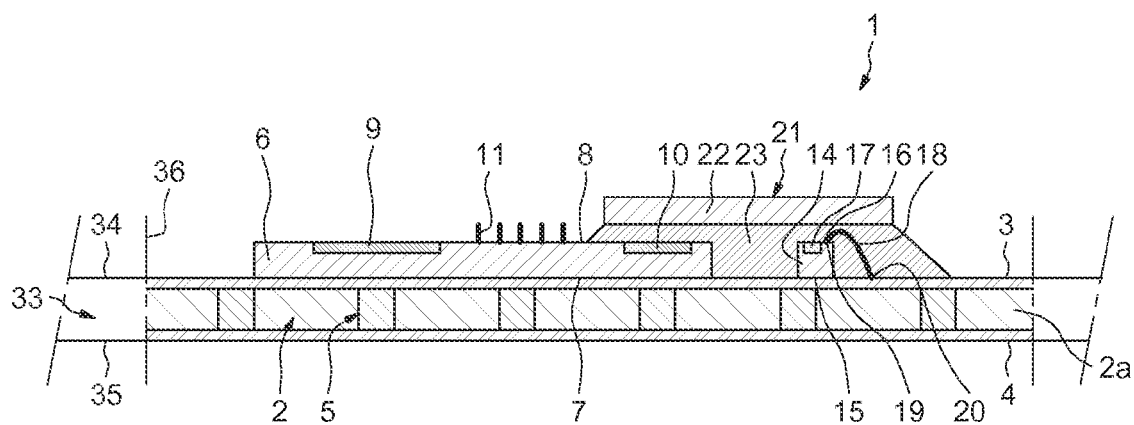
Figure 8:
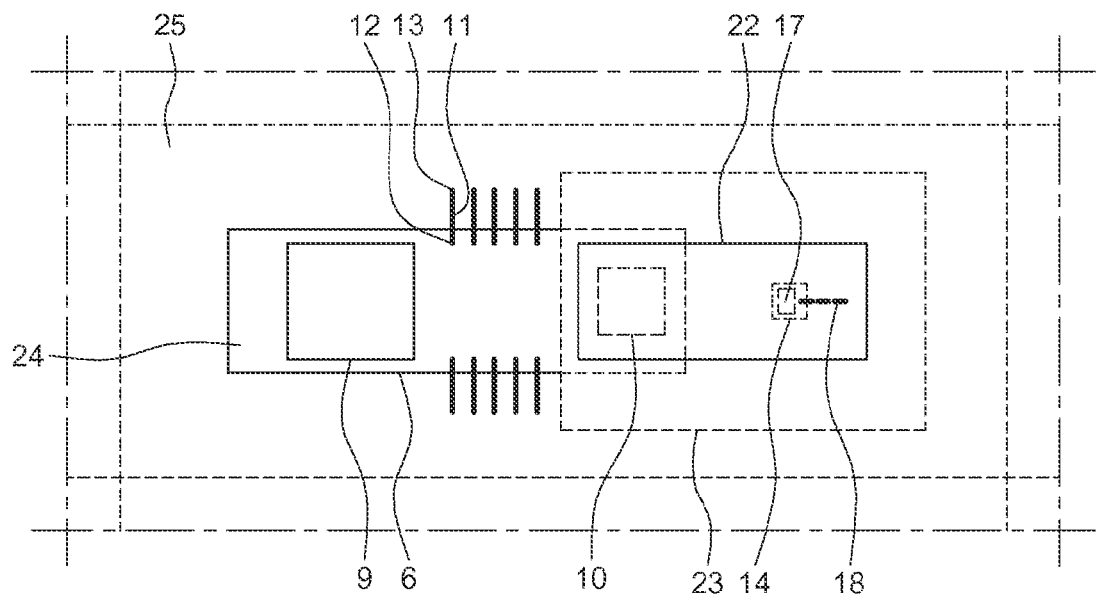

Then, as illustrated in FIGS. 7 and 8, using a tool which is not represented, in each placement 36, a transparent plate 22 is placed on the liquid drop 36 which is crushed and spreads under this transparent plate 22. When the transparent plate 22 is in the desired position, the material of the deformed drop 37 is made to harden, for example under the effect of an ultraviolet radiation, so as to obtain the transparent encapsulation block 23. The transparent encapsulation means 21 is thus obtained.

Figure 9:
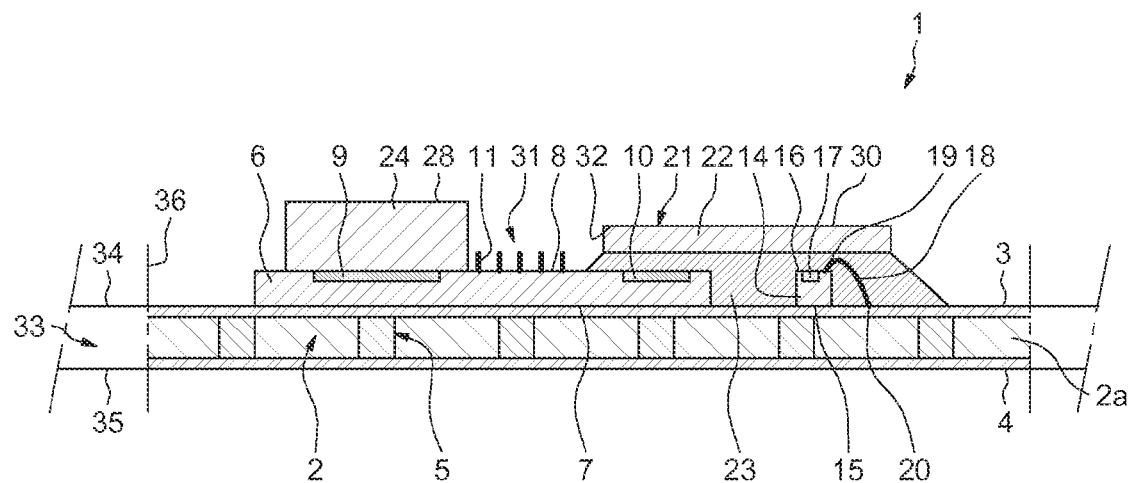
Figure 10:
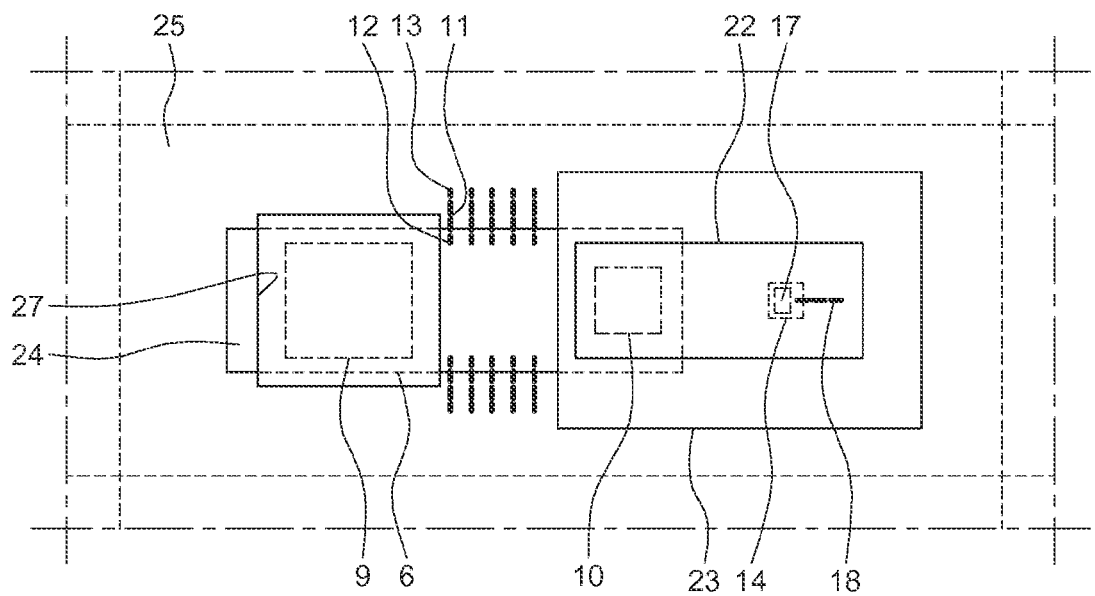

Then, as illustrated in FIGS. 9 and 10, in each placement 36, the transparent plate 24 is put in place on the receiving chip 6.

According to a variant embodiment, the transparent plate 24 could be put in place before the transparent encapsulation means 21 is produced.

Figure 11:
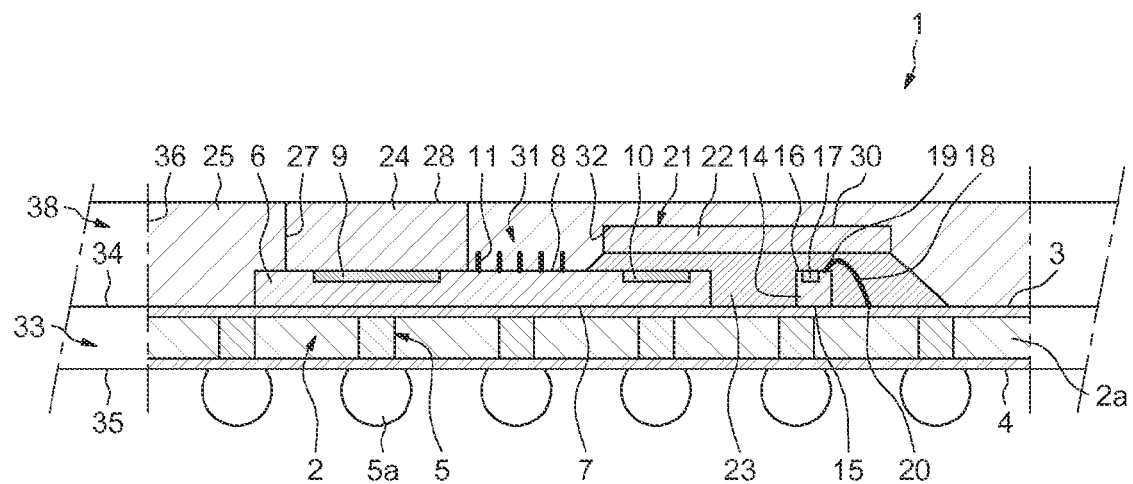

Then, as illustrated in FIG. 11, a layer 38 of a liquid material is spread which, after hardening, forms an opaque encapsulation block 25 in each placement 36.

Figure 12:
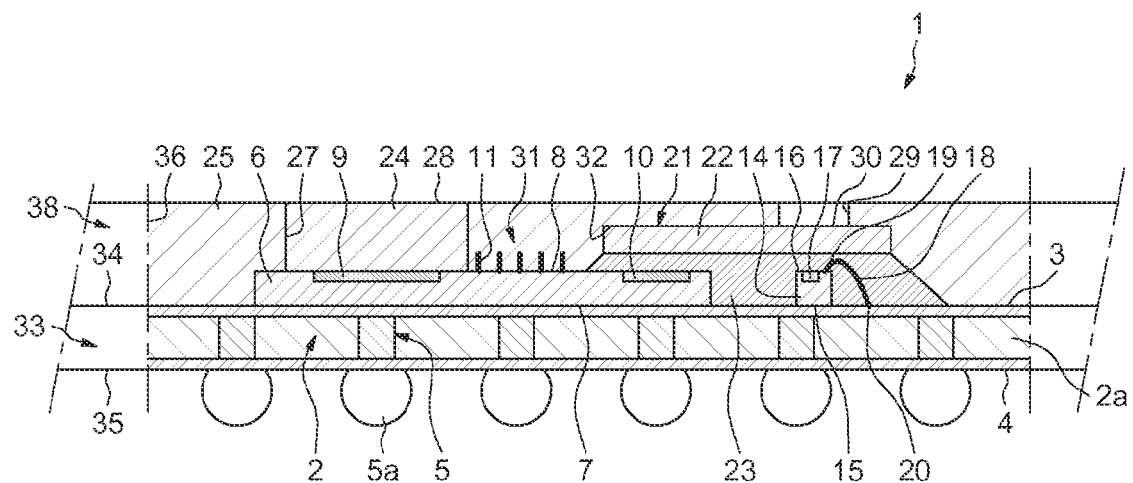

Then, as illustrated in FIG. 12, in each placement 36, a through opening 29 is produced above the transparent plate 22, by the removal of material, for example under the effect of a laser radiation, a water jet or a chemical attack.

Figure 13:
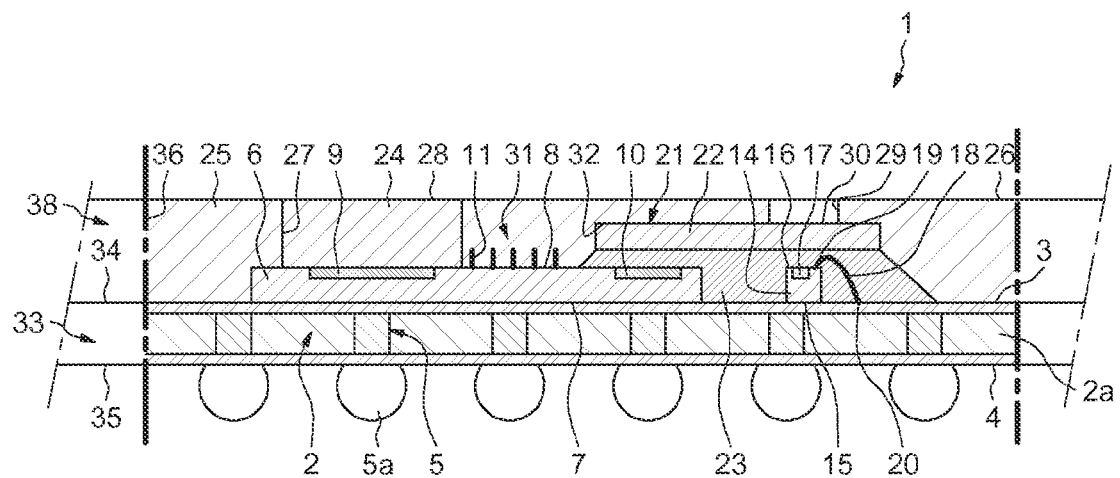
Figure 14:
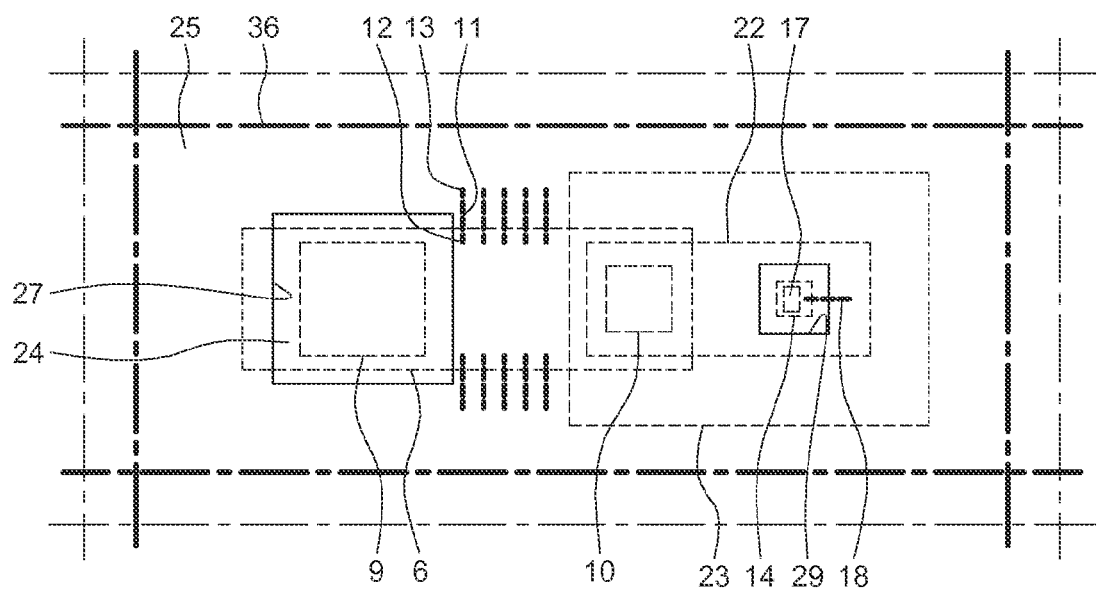

Then, after having put in place the electrical connection elements 5a, the different electronic packages 1 are singularized by proceeding to cut along the edges of the placements 36, as is illustrated in FIGS. 13 and 14. A plurality of optical electronic packages 1 are then obtained.

Figure 15:
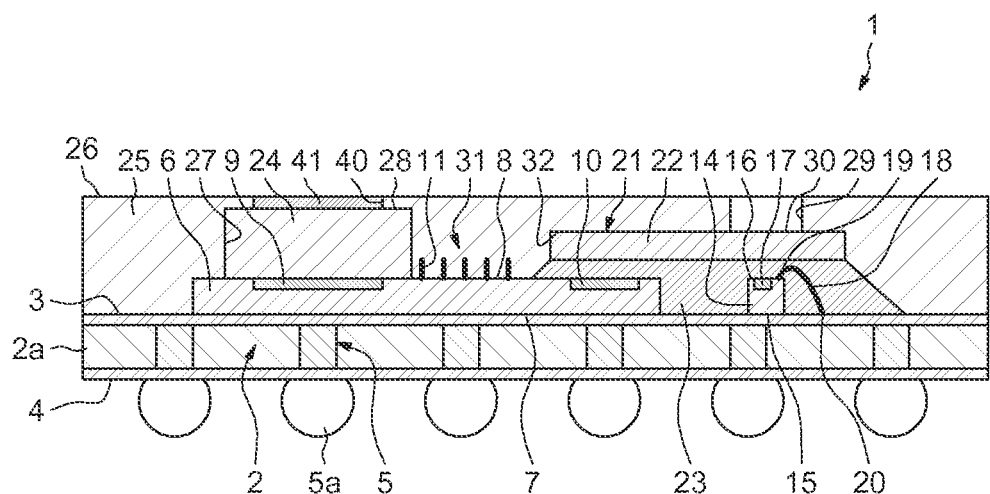
FIG. 15 represents a longitudinal cross section of a variant embodiment of the optical electronic package according to the present invention.

According to a variant embodiment illustrated in FIG. 15, the encapsulation block 25 has a thickness such that it covers the transparent plate 24. At least one through opening 40 is produced above the transparent plate 24 through the covering part, above the main optical sensor 9 in at least one sensitive area. This opening 40 can be produced at the same time as the opening 29.

According to a variant embodiment, the through opening 40 and/or the through opening 29 can be filled with a light-diffusing material 41.

The electronic packages which have just been described could be installed inside the jacket or the shell of a portable or mobile telephone having openings facing optical transmitters and main optical sensors, so as to form proximity detectors capable of detecting the presence or the absence of an object or a part of the human body, in order to generate a particular command in the electronic circuits of the telephone.

According to a variant embodiment, the part including the main optical sensor 9 could be eliminated, the electronic package then being limited to the part including the optical transmitter 17 and the secondary sensor 10, the transparent encapsulation block 23 and the transparent plate 22 being embedded in a smaller opaque encapsulation block 25. According to another variant embodiment, the part including the main optical sensor 9 could be replaced by other electronic components.

The present invention is not limited to the examples described above. It is in particular immediately obvious to combine the different arrangements of the electronic packages described in different ways. Many other variant embodiments are possible, without departing from the framework defined by the appended claims.

What is claimed is:

1. An optical electronic package, comprising:
    a substrate wafer having a front face and a rear face;
    a transmitting integrated circuit chip having a rear face fixed to the front face of the substrate wafer and comprising, in a front face, a light radiation optical transmitter;
    a receiving integrated circuit chip having a rear face fixed to the front face of the substrate wafer and comprising, in a front face, a first light radiation optical sensor;
    a transparent encapsulation structure comprising a transparent plate extending directly over said first light radiation optical sensor and directly over said optical transmitter and a transparent encapsulation block which extends between the rear face of the transparent plate and the front face of the receiving integrated circuit chip and between the rear face of the transparent plate and the front face of the substrate wafer, embedding the transmitting integrated circuit chip; and
    an opaque encapsulation structure formed by an opaque encapsulation block extending over the front face of the transparent plate and having a front through opening which reveals a front area of the transparent plate, this front area being situated above the optical transmitter of the transmitting integrated circuit chip and offset laterally relative to the first light radiation optical sensor of the receiving integrated circuit chip.

2. The package according to claim 1, further comprising a second light radiation optical sensor and a main transparent plate placed over the second light radiation optical sensor.

3. The package according to claim 2, wherein the opaque encapsulation block includes an opening in which the main transparent plate is located.

4. The package according to claim 3, further comprising a diffusion substance in the opening of the opaque encapsulation block for the main transparent plate.

5. The package according to claim 1, further comprising a diffusion substance in the front through opening of the opaque encapsulation block for the transparent plate.

6. The package according to claim 1, wherein the substrate wafer comprises an electrical connection network linked to said integrated circuit chips and is provided with external electrical connection elements.

7. An optical electronic package, comprising:
    a substrate wafer having a front face and a rear face;
    a transmitting integrated circuit chip having a rear face fixed to the front face of the substrate wafer and comprising, in a front face, a light radiation optical transmitter;
    a receiving integrated circuit chip having a rear face fixed to the front face of the substrate wafer and comprising, in a front face, at least one main light radiation optical sensor and one secondary light radiation optical sensor;
    a main transparent plate placed directly over the main light radiation optical sensor;
    a transparent encapsulation structure comprising a secondary transparent plate extending over said secondary light radiation optical sensor and over said optical transmitter and a transparent encapsulation block which extends between the rear face of the secondary transparent plate and the front face of the receiving integrated circuit chip including the secondary light radiation optical sensor and between the rear face of the transparent plate and the front face of the substrate wafer, embedding the transmitting integrated circuit chip;

an opaque encapsulation structure formed by an opaque encapsulation block, said opaque encapsulation block extending over the front face of the transparent plate and having a secondary front through opening which reveals a front area of the secondary transparent plate, this front area being situated above the optical transmitter of the transmitting integrated circuit chip and offset laterally relative to the secondary light radiation optical sensor of the receiving integrated circuit chip, said opaque encapsulation block further having a main front through opening in which the main transparent plate is situated.

8. The package according to claim 7, further comprising a diffusion substance in the main front through opening of the opaque encapsulation block.

9. The package according to claim 7, comprising a diffusion substance in the secondary through opening of the opaque encapsulation block.

10. The package according to claim 7, wherein the substrate wafer comprises an electrical connection network linked to said integrated circuit chips and is provided with external electrical connection elements.

11. A portable device, comprising:
a shell having an opening; and
a package located within the shell and facing the opening in the shell, said package comprising:
 a transmitting integrated circuit chip having a light radiation optical transmitter;
 a receiving integrated circuit chip having at least one light radiation optical sensor;
 a transparent encapsulation structure comprising a transparent plate extending directly over said at least one light radiation optical sensor and directly over said optical transmitter and a transparent encapsulation block which extends between the rear face of the transparent plate and the front face of the receiving integrated circuit chip and between the rear face of the transparent plate to embed the transmitting integrated circuit chip; and
 an opaque encapsulation structure extending over the front face of the transparent plate and having an opening above a front area of the transparent plate, this front area being situated above the optical transmitter of the transmitting integrated circuit chip and offset laterally relative to the at least one light radiation optical sensor of the receiving integrated circuit chip.

12. The portable device of claim 11, wherein the opening above the front area of the transparent plate faces the opening in the shell.

13. The portable device of claim 11, wherein the receiving integrated circuit chip further includes an additional light radiation optical sensor, and wherein the opaque encapsulation structure includes a second opening above the additional light radiation optical sensor.

14. The portable device of claim 13, further including a transparent plate located within the second opening.

15. The portable device of claim 13, wherein the second opening faces the opening in the shell.

16. An optical electronic package, comprising:
a substrate wafer;
a transmitting integrated circuit chip mounted to the substrate wafer and comprising a light radiation optical transmitter;
a receiving integrated circuit chip mounted to the substrate wafer and comprising a main light radiation optical sensor and a secondary light radiation optical sensor;
a main transparent plate placed over the main light radiation optical sensor;
a transparent encapsulation structure comprising:
 a transparent encapsulation block which embeds the transmitting integrated circuit chip and covers both the secondary light radiation optical sensor and said optical transmitter; and
a secondary transparent plate which is secured by the transparent encapsulation block and positioned to extend directly over both the secondary light radiation optical sensor and said optical transmitter;
an opaque encapsulation block that at least surrounds the main transparent plate and completely covers the secondary transparent plate, said opaque encapsulation block including a through opening extending into a front surface of opaque encapsulation block to reach the secondary transparent plate at a position that is vertically aligned with the optical transmitter of the transmitting integrated circuit chip and offset laterally relative to the secondary light radiation optical sensor of the receiving integrated circuit chip.

17. The package according to claim 16, further comprising a diffusion substance in the through opening of the opaque encapsulation block.

* * * * *